United States Patent
Ausserlechner

(10) Patent No.: US 10,564,055 B2
(45) Date of Patent: Feb. 18, 2020

(54) CIRCUIT FOR DETERMINING MECHANICAL STRESS LEVELS BASED ON CURRENT GAINS

(71) Applicant: Infineon Technologies AG, Neubiberg (DE)

(72) Inventor: Udo Ausserlechner, Villach (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 16/050,271

(22) Filed: Jul. 31, 2018

(65) Prior Publication Data

US 2018/0335355 A1    Nov. 22, 2018

Related U.S. Application Data

(63) Continuation of application No. 15/190,277, filed on Jun. 23, 2016, now Pat. No. 10,078,022.

(30) Foreign Application Priority Data

Jul. 1, 2015  (DE) .................. 10 2015 110 579

(51) Int. Cl.
*G01B 7/16*    (2006.01)
*G01L 1/22*    (2006.01)
(Continued)

(52) U.S. Cl.
CPC .......... *G01L 1/2281* (2013.01); *G01L 1/2293* (2013.01); *H01L 29/84* (2013.01); *G01L 1/16* (2013.01)

(58) Field of Classification Search
CPC ....... G01L 1/2291; G01L 1/2293; G01L 1/16; G01L 1/225; H01L 29/84; H01L 129/84;
(Continued)

(56) References Cited

U.S. PATENT DOCUMENTS 5,323,054 A    6/1994  Kanda et al.
7,437,260 B2 *  10/2008  Ausserlechner ...... G01L 5/0047
                                                   257/427
(Continued)

FOREIGN PATENT DOCUMENTS

CN    203550968 U    4/2014
DE    102004003853 A1    8/2005

OTHER PUBLICATIONS

Hussain, Safina, Richard C. Jaeger, Jeffrey C. Suhling, Bogdan M. Wilamowski, Michael C. Hamilton, Parameshwaran Gnanachchelvi, "Understanding the Impact of Temperature Variations on Measurement of Stress Dependent Parameters of Bipolar Junction Transistors", 2014 IEEE Intersociety Conference on Thermal and Thermomechanical Phenomena in Electronic Systems (ITherm), May 27-May 30, 2014, pp. 1244-1250. DOI: 10.1109/ITHERM.2014.6892423.

*Primary Examiner* — Harshad R Patel
*Assistant Examiner* — Nigel H Plumb
(74) *Attorney, Agent, or Firm* — Design IP

(57) ABSTRACT

A stress sensor includes a semiconductor die to which a mechanical stress is applied. The semiconductor die includes at least one bipolar junction transistor; at least one current source configured to inject at least one current through the at least one bipolar junction transistor; and a processing circuit configured to measure a first current gain and a second current gain of the at least one bipolar junction transistor based on the at least one injected current, to determine a first mechanical stress level based on the first current gain, to determine a second mechanical stress level based on the second current gain, and to generate a mechanical stress level signal based on the first mechanical stress level and the second mechanical stress level, wherein the mechanical stress level signal represents the applied
(Continued)

mechanical stress, at least a portion of which is applied to the at least one bipolar junction transistor.

20 Claims, 3 Drawing Sheets

(51) Int. Cl.
*H01L 29/84* (2006.01)
*G01L 1/16* (2006.01)

(58) Field of Classification Search
CPC . G01R 35/00; G01B 7/18; G01B 5/30; G01N 3/08
See application file for complete search history.

(56) References Cited

U.S. PATENT DOCUMENTS

| | | |
|---|---|---|
| 7,528,507 B2 | 5/2009 | Carson et al. |
| 10,078,022 B2 * | 9/2018 | Ausserlechner ...... G01L 1/2281 |
| 2009/0206449 A1 | 8/2009 | Cooney, III et al. |
| 2011/0298705 A1 | 12/2011 | Vaganov |
| 2014/0285175 A1 * | 9/2014 | Lasseuguette ............ G05F 3/30 323/313 |
| 2014/0299544 A1 * | 10/2014 | Wilt .................... A61M 1/1601 210/646 |

\* cited by examiner

CIRCUIT FOR DETERMINING MECHANICAL STRESS LEVELS BASED ON CURRENT GAINS

CROSS REFERENCE TO RELATED APPLICATIONS

This application is a continuation of U.S. patent application Ser. No. 15/190,277 filed on Jun. 23, 2016, which claims the benefit of German Patent Application No. 10 2015 110 579.9 filed on Jul. 1, 2015, which are incorporated by reference as if fully set forth.

FIELD

Embodiments relate to circuitry that provides a mechanical stress level signal and to a corresponding method.

BACKGROUND

Most types of packages like the plastic encapsulated (PEL) package exert mechanical stress on a semiconductor die supplied by the package. Reasons for such mechanical stress are versatile and may be based on, e.g., a mismatch of thermal coefficients of expansion (CTE) of the package constituents (mold compound, semiconductor die, leadframe), a moisture uptake or a chemical cure shrink of organic parts of the package (mold compound, adhesives). The mechanical stress may be of significant size, e.g., amount up to 300 megapascal (MPa) and beyond. The semiconductor die itself may be subject to compression (i.e. negative stress), but the use of die coatings, glob tops or ceramic packages may lead to tension (i.e. positive stress).

Stress is risk factor affecting the reliability of a circuitry and it may alter parameters of electronic components of the semiconductor die. This can reduce, e.g., an accuracy of Hall sensor circuits, bandgap circuits, temperature sensors, on-chip relaxation oscillators or current references.

A linear relation between a stress vector T and a normal vector n follows from the fundamental laws of conservation of linear momentum and static equilibrium of forces. The components of the Cauchy stress tensor at every point in a material satisfy the equilibrium equations (Cauchy's equations of motion for zero acceleration). Moreover, the principle of conservation of angular momentum implies that the stress tensor is symmetric. Therefore, the stress state of the medium at any point and instant can be specified by only six independent parameters, rather than nine, i.e., $$\begin{bmatrix} \sigma_{xx} & \sigma_{xy} & \sigma_{xz} \\ \sigma_{xy} & \sigma_{yy} & \sigma_{yz} \\ \sigma_{xz} & \sigma_{yz} & \sigma_{zz} \end{bmatrix},$$

wherein the elements $\sigma_{xx}$, $\sigma_{yy}$, $\sigma_{zz}$ are referred to as orthogonal normal stresses (relative to the chosen coordinate system), and the elements $\sigma_{xy}$, $\sigma_{xz}$, $\sigma_{yz}$ are referred to as orthogonal shear stresses.

Due to the laminar structure of the package, the main portion of the die surface has dominant stress components amounting to $\sigma_{xx}$ and $\sigma_{yy}$ (in case the surface of the die is arranged in a x-y-plane). For such dies, in particular for the circuits that are provided by the die, it is beneficial to monitor or measure the mechanical stress.

SUMMARY

A first embodiment relates to a circuitry for providing a mechanical stress level signal, comprising: at least one bipolar junction transistor, wherein the circuitry is arranged to determine a first mechanical stress level based on a current gain of the at least one bipolar junction transistor and to determine a second mechanical stress level based on the current gain of the at least one bipolar junction transistor, and to provide the mechanical stress level signal based on the first mechanical stress level and the second mechanical stress level.

A second embodiment relates to a method for determining a mechanical stress level signal, comprising: determining a first mechanical stress level based on a current gain of at least one bipolar junction transistor, determining a second mechanical stress level based on the current gain of the at least one bipolar junction transistor, and determining the mechanical stress level signal based on the first mechanical stress level and the second mechanical stress level.

A third embodiment is directed to a computer program product directly loadable into a memory of a digital processing device, comprising software code portions for performing the steps of the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 2:
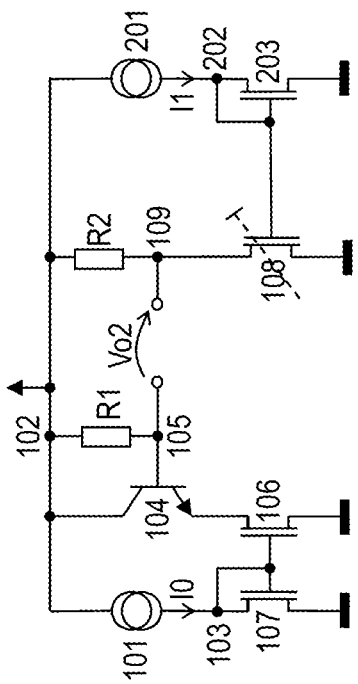
FIG. 2 shows an exemplary circuit diagram of a stress sensor with an output voltage Vo2 with an increased stress sensitivity compared to the circuitry shown in FIG. 1.

Embodiments of the present invention relate to a circuitry and methods for providing a mechanical stress level signal. A stress sensor according to the embodiments may provide high sensitivity to a specific set of mechanical stress components, it may experience (substantially) no crosstalk from other stress components, and/or it may have a defined, low or reduced temperature dependence.

Piezo-resistive stress sensors that respond to mechanical stress components $\sigma_{xx}+\sigma_{yy}$ are known. Also, piezo-resistive stress sensors and piezo-MOS stress sensors that respond to the mechanical stress components $\sigma_{xx}-\sigma_{yy}$ are known.

Examples presented herein provide stress sensors (stress sensor elements) comprising circuits which utilize a mechanical stress dependence of at least one bipolar junction transistor's current gain to measure the stress component $\sigma_{xx}+\sigma_{yy}$ with high sensitivity.

A current gain of vertical bipolar junction transistors (BJTs) in (100)-silicon amounts to:

$$\beta = \beta_0 \cdot \left(1 + (\pi_{12}^{emitter} - \pi_{12}^{base}) \cdot (\sigma_{xx} + \sigma_{yy}) + (\pi_{11}^{emitter} - \pi_{11}^{base}) \cdot \sigma_{zz} - \frac{\Delta E_{GBE}}{kT} - 0.2 \cdot \frac{\Delta T}{T}\right),$$

wherein
- $\pi_{11}$, $\pi_{12}$ are piezo-resistive coefficients for minority carriers in emitter and base at the respective doping levels,
- $\Delta E_{GBE}$ is a change in bandgap narrowing (=difference in bandgaps between base and emitter),
- T is an absolute temperature, and
- k is Boltzmann's constant.

The change in bandgap narrowing $\Delta E_{GBE}$ is basically constant versus the mechanical stress and its temperature dependence may also be negligible.

The values of the piezo-resistive coefficients $\pi_{11}$, $\pi_{12}$ decrease with higher doping levels. The piezo-resistive coefficients of minority carriers are similar to those of majority carriers.

For an npn-type transistor with base doping amounting to less or equal $10^{18}/cm^3$ and an emitter doping of more than $10^{20}/cm^3$ the following coefficients are known:

$$\pi_{11}^{base} = \frac{-80\%}{GPa}; \pi_{11}^{emitter} = \frac{2\%}{GPa}$$
$$\pi_{12}^{base} = \frac{44\%}{GPa}; \pi_{12}^{emitter} = \frac{-1\%}{GPa}$$

This results in a stress dependency of the current gain amounting to (−45%)/GPa for $\sigma_{xx}+\sigma_{yy}$ and to (λ82%)/GPa for $\sigma_{zz}$, wherein the stress component $\sigma_{zz}$ is orthogonal to the x-y-plane.

A stress sensitivity of the current gain in view of the sum of the stress components $\sigma_{xx}+\sigma_{yy}$ is large compared to a lateral resistor-L-arrangement (i.e. resistors arranged in L-form in the x-y-plane, in particular two resistors arranged perpendicular to each other within the x-y-plane) of low n-doped resistors in (100)-silicon that have a stress coefficient amounting to (−24%)/GPa.

The advantage of the current gain being a stress dependent quantity over, e.g., resistance is that the current gain has dimension 1, whereas the resistance has a dimension voltage over current. For a circuitry a comparison of two quantities of the same dimension is favorable over the increased complexity of a comparison of different dimensions. Also, comparing values of different dimensions may also result in reduced accuracy.

For example, it is rather efficient to compare a collector current with a base current in order to determine the current gain. However, it is less trivial to compare a voltage across a resistor with a current through this resistor in order to determine its resistance. For the latter, a second resistor with different stress dependency but similar temperature dependency between both may be required to extract the stress by comparison between both. With the solution presented herein, there is no need for a second transistor to determine the mechanical stress.

The circuitry may utilize any two of the following currents: base current $I_b$, collector current $I_c$ or base current Ib. The current gain may be determined as a ratio of the collector current $I_c$ over the base current $I_b$, i.e.:

$$\beta = \frac{I_c}{I_b}.$$

However, a ratio of the emitter current over the base current is equal to the current gain plus one, i.e.:

$$\frac{I_e}{I_b} = \beta + 1.$$

Also, a ratio of the emitter current over the collector current may be considered, which is equal to:

$$\frac{I_e}{I_c} = \frac{1+\beta}{\beta}.$$

The current gain of the npn-type transistor decreases with mechanical stress (e.g., by (−45%)/GPa). The current gain of a pnp-type transistor increases with stress, because the stress dependence of the current gain is determined by the piezo-coefficients of the base, which have opposite signs for n- and p-doping.

Hence, the stress sensitivity can be increased by comparing the current gains of npn- and pnp-type transistors. Such comparison cancels out (or significantly reduces) common terms like a residual temperature dependence. Hence, current gains of npn- and pnp-type transistors have an opposite dependency on stress, but a similar temperature-dependency. By means of subtraction the temperature dependency may be cancelled (or at least be significantly reduced) and the stress dependency may be amplified.

A combination of transistors with resistors can be used to increase (in particular to maximize) the stress sensitivity of the stress sensor.

Instead of vertical transistors, lateral transistors can be used. In such case, each vertical transistor may be replaced by two identical lateral transistors (i.e. of the same type), which are arranged perpendicular to each other. This is also referred to as an L-layout.

The sensitivity of the transistor stress sensor can also be improved by means of cascading: a current is injected into an emitter of a first transistor and extracted from its base, then multiplied, e.g., by a current mirror and injected into an emitter of a second transistor and extracted from its base. With each additional transistor stage the stress-sensitivity approximately doubles.

Figure 1:
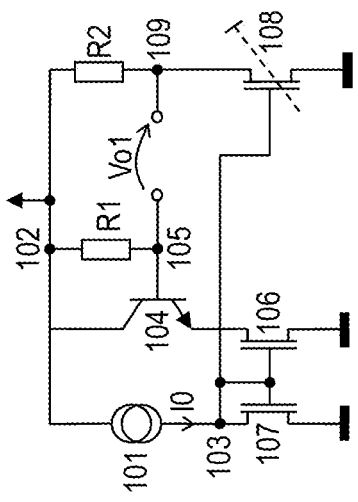
FIG. 1 shows an exemplary circuit diagram of a stress sensor with an output voltage Vo1 utilizing an npn transistor.

FIG. 1 shows an exemplary circuit diagram of a stress sensor with an output voltage Vo1. A current source 101 is connected between a node 102 and the node 103. A current I0 is provided towards the node 103. The collector of an npn transistor 104 is connected to the node 102. The base of the transistor 104 is connected to a node 105 and the emitter of the transistor 104 is connected to the drain of an NMOS (n-channel MOSFET) 106, wherein the source of the NMOS 106 is connected to ground.

The node 103 is connected to the drain of an NMOS 107, wherein the source of the NMOS 107 is connected to ground. The gate of the NMOS 106 is connected to the gate of the NMOS 107 and to the node 103. The node 103 is further connected to a gate of an NMOS 108. The source of the NMOS 108 is connected to ground.

A resistor R1 is arranged between the node 102 and the node 105. A resistor R2 is arranged between the node 102 and a node 109. The node 109 is connected to the drain of the NMOS 108.

The output voltage Vo1 is provided between the node 105 and the node 109. The node 102 may be connected to a supply voltage.

The NMOS transistors 107 and 106 act as current sources: The NMOS 106 forces an emitter current through the NPN transistor 104. A fraction $1/(1+\beta)$ of this emitter current flows through the resistor R1 and into the base of the transistor 104. The NMOS 108 forces a current through the resistor R2. The output voltage Vo1 results in:

$$Vo1 = \frac{R1 \cdot I_{106}}{1+\beta} - R2 \cdot I_{108},$$

wherein
$I_{106}$ is the current through the NMOS 106, and
$I_{108}$ is the current through the NMOS 108.

In the circuit layout, the NMOS transistors 106 to 108 may be arranged close to each other to be exposed to an equal amount of mechanical stress as well as to substantially the same temperature. Then, the currents flowing through the NMOS transistors may depend substantially on the ratios of channel sizes amounting to W/L (ratio of width W and length L).

As an option, the size of the NMOS 108 may be trimmed to adjust the output voltage Vo1 to a predetermined value at a reference stress and/or reference temperature.

It is another option to locate the resistors R1 and R2 closely to each other such that they are exposed to substantially the same amount of mechanical equal stress as well as temperature. If the same amount of mechanical stress is assumed to impact the transistor 104 as well as the resistors R1, R2, the output voltage Vo1 results in:

$Vo1 = R_{10} \cdot x_1 \cdot I_{00} \cdot (\pi_1 - \pi_2 - \pi_\beta - \pi_0) \cdot (\sigma_{xx} + \sigma_{yy})/(1+\beta_0)$ with current mirror ratios:

$$x_1 = \frac{I_{106}}{I_{107}}; \quad x_2 = \frac{I_{108}}{I_{107}},$$

wherein $I_{107}$ is the current through the NMOS 107, and stress sensitivities:

$R1 = R_{10} \cdot (1+\pi_1 \cdot (\sigma_{xx}+\sigma_{yy}))$, $R2 = R_{20} \cdot (1+\pi_2 \cdot (\sigma_{xx}+\sigma_{yy}))$, $I0 = I_{00} \cdot (1+\pi_0 \cdot (\sigma_{xx}+\sigma_{yy}))$, $\beta = \beta_0 \cdot (1+\pi_\beta \cdot (\sigma_{xx}\sigma_{yy}))$, wherein $\pi_0$ is the coefficient of the current source 101 and $\pi_\beta$ is the coefficient of the current gain of the transistor 104.

The stress component that is perpendicular to the chip surface, i.e. the z-component when the chip surface is the x-y-plane, can be omitted, because this stress component in z direction is much smaller than the in-plane stress components.

According to yet another assumption already included into the formula to obtain Vo1, the current mirror comprising NMOS 108 is trimmed in order to obtain zero output voltage Vo1 at zero mechanical stress (e.g. on wafer level), i.e.:

$R_{20} \cdot x_2 = R_{10} \cdot x_1/(1+\beta_0)$

The piezo-resistive coefficients $\pi_1$ and $\pi_2$ of the resistors R1 and R2 combine with the piezo-coefficient $\pi_\beta$ of the current gain. Hence, the stress sensitivity can be increased: With the coefficient $\pi_\beta<0$, this may result in $\pi_2<0$ and $\pi_1>0$. Hence, the resistor R2 may be a lateral low n-doped resistor-L with a stress coefficient amounting to $(-24\%)/GPa$ and the resistor R1 may be a vertical low n-doped resistor with a stress coefficient amounting to $(+53.4\%)/GPa$. As a result, the stress sensitivity of the output voltage Vo1 is proportional to:

$$\frac{53.4\% + 24.4\% + 45\%}{GPa} = \frac{122.8\%}{GPa}$$

compared to only 45%/GPa if both resistors R1 and R2 are identical. This results in an increase of sensitivity by a factor 2.7.

However, (substantially) identical resistors R1 and R2 may still be of advantage, because the temperature dependency of the output voltage Vo1 is smaller than for the resistors R1 and R2 being of different types of resistors with different temperature dependencies.

The stress sensitivity may be even further increased.

FIG. 2 shows an exemplary circuit diagram of a stress sensor with an output voltage Vo2. The circuit diagram of FIG. 2 is based on FIG. 1.

In contrast to FIG. 1, the node 103 is not connected to the gate of the NMOS 108. Instead, the node 102 is connected via a current source 201 to a node 202. The node 202 is connected to the drain of an NMOS 203. The source of the NMOS 203 is connected to ground. The gate of the NMOS 203 is connected to the node 202 and to the gate of the NMOS 108. A current I1 is provided towards the node 202.

The current I1 is mirrored by an adjustable current mirror comprising the NMOS 203 and the NMOS 108 and it is forced to flow over the resistor R2 that has a piezo-coefficient $\pi_2>0$. The current I0 is mirrored by a current mirror comprising the NMOS 107 and the NMOS 106 and it is obtained from the emitter of the npn transistor 104. There it causes a base current that flows over the resistor R1 which has a piezo-coefficient $\pi_1>0$.

Hence, according to FIG. 2 the currents I0 and I1 can be made stress-dependent, wherein the stress-dependency of the current I0 can be made in an opposite direction compared to the stress-dependency of the current I1. Hence with an increasing stress, one of the currents increases the other one decreases, which results in a significant increase of the stress-sensitivity of the output voltage Vo2.

In FIG. 2 the current I0 is derived from a resistance of the same type as the resistor R2. Therefore the stress dependency of the current I0 has the same magnitude and opposite sign as the stress dependency of the resistor R2.

The current I0 is sent through the transistor 104, whose current gain $\beta$ decreases. As a consequence, the base current increases even more than the current I0 does. Since the resistor R1 increases too, the voltage across the resistor R1 increases significantly. Conversely, the current I1 decreases, because it is derived from the type as the resistor R1, which increases. This current I1 is mirrored onto the resistor R2, which decreases, so that the voltage across R2 decreases more than the current I1 does. Thus the output voltage Vo2 is proportional to:

$$Vo2 \sim (2\pi_1 - 2\pi_2 - \pi_\beta) \cdot (\sigma_{xx} + \sigma_{yy}),$$

amounting to:

$$(2 \cdot 53.4\% + 2 \cdot 24.4\% + 45\%)/GPa = 200.6\%/GPa,$$

which is nearly 4.5 times larger than if the resistors R1 and R2 would be identical.

It is noted that "type" of resistor may comprise any of the following: a vertical n-doped resistor, a lateral n-doped resistor, a resistor that may be arranged in an L-shape (planar in an x-y-plane), a lateral resistor in an epitaxy layer, a polysilicon resistor, and a p-doped resistor, e.g., a resistor that is arranged in a p-doped base of an npn transistor.

Resistors of the same type may have (substantially) the same temperature coefficient and the same stress dependency, but they may have different resistance values.

The circuit utilizes an npn transistor 104. However, a pnp-type transistor can be applied in an analogue manner.

Figure 3:
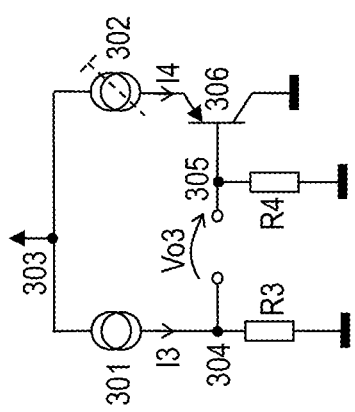
FIG. 3 shows an exemplary circuit diagram of a stress sensor with an output voltage Vo3 utilizing a pnp transistor.

FIG. 3 shows an exemplary circuit diagram of a stress sensor with an output voltage Vo3 utilizing a pnp transistor 306.

The emitter of the transistor 306 is connected via a current source 302 to a node 303. As an option, the current source may be adjustable. The node 303 is connected via a current source 301 to a node 304. The node 303 may be connected to a supply voltage. The node 304 is connected via a resistor R3 to ground. The base of the transistor 306 is connected to a node 305. The node 305 is connected via a resistor R4 to ground. The collector of the transistor 306 is connected to ground. A current I3 is conveyed towards the node 304 from the node 303 and a current I4 is conveyed towards the emitter of the transistor 306 from the node 303. The output voltage Vo3 is provided between the node 304 and the node 305.

As indicated above, the current gain of a transistor may also depend on the temperature. Therefore, a temperature drift of the output voltage may be compensated. Compensation in this regard refers to reducing the temperature drift or the negative impact based on such temperature drift. The compensation described herein may refer to a partial or a full compensation of such negative impact. The temperature drift may in particular be reduced by utilizing a combination of at least one npn-type transistor and at least one pnp-type transistor.

Figure 4:
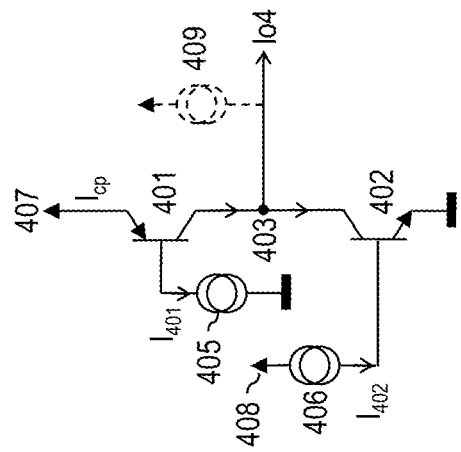
FIG. 4 shows an exemplary circuitry comprising a pnp transistor and an npn transistor for reducing a temperature drift.

FIG. 4 shows an exemplary circuitry for reducing a temperature drift. A node 407 (which may be connected to a supply voltage) is connected to the emitter of a pnp transistor 401. The collector of the transistor 401 is connected to a node 403, which is connected to the collector of an npn transistor 402. The emitter of the transistor 402 is connected to ground.

A current source 405 is connected between the base of the pnp transistor 401 and ground. A current $I_{401}$ flows from the base of the transistor 401 towards ground.

A current source 406 is connected between a node 408 and the base of the npn transistor 402. A current $I_{402}$ flows from the node 408 towards the base of the transistor 402. It is noted that the node 407 and the node 408 may be connected to at least one supply voltage, in particular to different supply voltages.

An output current Io4 is provided via the node 403. As an option, the node 403 may be connected to a current source 409 to supply an offset.

The current source 406 forces the base current $I_{402}$ of the npn transistor 402 and the current source 405 forces the base current $I_{401}$ of the pnp transistor 401. The collector terminals of the npn transistor 402 and the pnp transistor 401 are short-circuited. If an ohmic load is connected to the node 403, the output current Io4 results in the difference of both collector currents. Thus, the output current Io4 has a high mechanical stress sensitivity and a reduced temperature dependency compared to a single collector current of an npn or a pnp transistor as follows:

$$Io4 = I_{401} \cdot \beta^{pap} - I_{402} \cdot \beta^{npn}.$$

Also, like in the examples described above, the currents $I_{401}$, $I_{402}$ can be derived from a single current based on different ratios.

It is also an option that different types of resistors may be used to increase (or adjust) the level of stress sensitivity.

It may be advantageous to provide a circuitry such that the current $I_{402}$ decrease with mechanical stress, because also the current gain of the npn transistor 402 decreases with mechanical stress. Hence, the collector current of the transistor 402 decreases even stronger with mechanical stress. Conversely, the current $I_{401}$ may increase with stress, because the current gain of the pnp transistor 401 increases with stress. Hence, the collector current of the transistor 401 increases even stronger with stress. At least one of the currents $I_{402}$, $I_{401}$ may be trimmable to account for manufacturing effects of resistors and/or current gains of the transistors.

It is an option to add or subtract further currents to the output node 403, which is indicated by the current source 409, in order to shift the zero point (i.e. the stress and temperature at which Io4=0) of the output current Io4 and to trim the stress dependency of the output current Io4.

Figure 5:
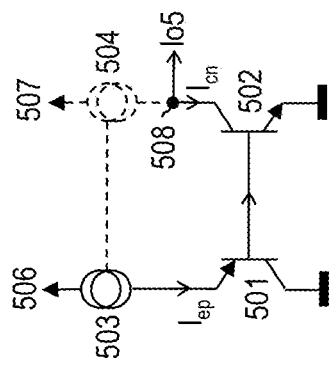
FIG. 5 shows an alternative circuitry for reducing the temperature drift.

FIG. 5 shows an exemplary circuitry for reducing a temperature drift. A node 506 is connected via a current source 503 to the emitter of a pnp transistor 501. The collector of the transistor 501 is connected to ground. A node 507 is connected via an optional (adjustable) current source 504 to the collector of an npn transistor 502, the emitter of the transistor 502 is connected to ground. The base of the transistor 501 is connected to the base of the transistor 502. An output current Io5 is supplied via a node 508 that is connected to the collector of the transistor 502.

The node 506 and the node 507 may be connected to at least one supply voltage.

The collector current of the npn transistor 502 is equal to a ratio of the current gain of the npn transistor 502 over the current gain of the pnp transistor 501 such that the stress-dependency of the collector current of the npn transistor 502 is proportional to the subtraction of piezo-coefficients of the npn transistor 502 minus the pnp transistor 501, whereby common thermal drifts (may at least partially, in particular fully) cancel out. Hence, the collector current $I_{cn}$ of the npn transistor 502 amounts to:

$$I_{cn} = \frac{I_{ep} \cdot \beta^{npn}}{1 + \beta^{pnp}},$$

wherein $I_{ep}$ is the emitter current of the pnp transistor 501.

The stress dependency of the output current Io5 can be trimmed by adding or subtracting a current to the node 508 which is in particular proportional to the current $I_{ep}$. This is exemplarily indicated by the current source 504 and its connection to the current source 503. It is noted that the polarity of the optional current may be arbitrary so that the optional current may flow into the output node 508 as well as it may flow out of it.

According to the example shown in FIG. 5, the base currents of the transistors 501 and 502 are identical. Since the current gain of the pnp transistor 501 may be lower than the current gain of the npn 502 transistor, the current $I_{ep}$ may be significantly smaller than the current $I_{cn}$. Both currents $I_{ep}$ and $I_{cn}$ may be made similar if the emitter area of the pnp transistor 501 is 5 to 20 times smaller than the emitter area of the npn transistor 502. It is also an option to extract the base current of the pnp transistor 501, manipulate it, e.g., by current mirrors and sink it again out of the base of the npn transistor 502. This may be suitable for reducing the "large" pnp base current to the level of the "small" npn base current.

It is noted that the transistors 501 and 502 may be realized as a combined structure. It may, e.g., utilize a 4-layer structure, e.g., a pnpn-structure.

Figure 6:
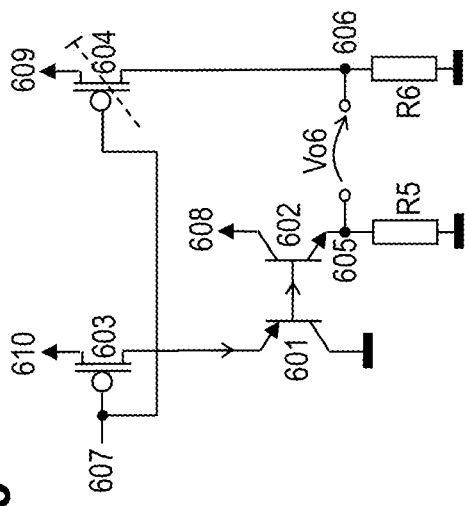
FIG. 6 shows yet an alternative circuitry for reducing temperature drift.

FIG. 6 shows an alternative circuitry for reducing temperature drift. The gate of a PMOS 603 (p-channel MOSFET) is connected to a node 607 and to the gate of a PMOS 604. The drain of the PMOS 603 is connected to the emitter of a pnp transistor 601, wherein the collector of this transistor 601 is connected to ground. The source of the PMOS 603 is connected to a node 610. The PMOS 603 and the PMOS 604 may be regarded as current sources, which are controlled via a signal applied to the node 607. The PMOS 604 may be adjustable.

The base of the transistor 601 is connected to the base of an npn transistor 602. The collector of the transistor 602 is connected to a node 608 and the emitter of the transistor 602 is connected to a node 605. The node 605 is connected via a resistor R5 to ground.

The source of the PMOS 604 is connected to a node 609 and the drain of the PMOS 604 is connected to a node 606. The node 606 is connected via a resistor R6 to ground.

The nodes 608, 609 and 610 (or a portion of these nodes) may be connected to the same supply voltage or to different supply voltages.

An output voltage Vo6 is provided across the nodes 605 and 606.

According to FIG. 6 the emitter current of the npn transistor 602 may be used, which flows over the resistor R5. The voltage drop across the resistor R5 is compared with the voltage drop across the resistor R6, which corresponds to the original current passing R6. Hence, the temperature stability of the output voltage Vo6 is improved compared to the embodiments shown in FIG. 1 to FIG. 3, because the temperature coefficients of the current gains of the npn transistor 602 and the pnp transistor 601 (nearly or fully) cancel each other out.

Figure 7:
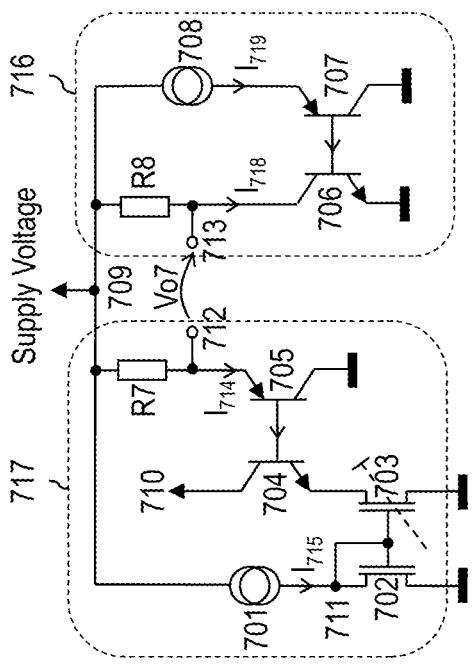
FIG. 7 shows another example of a circuitry, which combines the circuits shown in FIG. 5 and FIG. 6 by decoupling the collector current of the npn transistor and using this collector current according to the embodiment depicted in FIG. 5.

FIG. 7 shows another example of a circuitry, which combines the circuits shown in FIG. 5 and FIG. 6 by decoupling the collector current of the npn transistor and using this collector current according to the embodiment depicted in FIG. 5.

A supply voltage is fed to a node 709. The node 709 is connected via a current source 701 to a node 711. The drain of an NMOS 702 is connected to the node 711. The node 711 is further connected to the gate of the NMOS 702 and the gate of an (adjustable) NMOS 703. The source of the NMOS 702 and the source of the NMOS 703 are connected to ground.

A node 710 is connected to a collector of an npn transistor 704. The emitter of the transistor 704 is connected to the drain of the NMOS 703. The base of the transistor 704 is connected to the base of a pnp transistor 705. The collector of the transistor 705 is connected to ground and the emitter of the transistor 705 is connected to a node 712. The node 712 is connected via a resistor R7 to the node 709.

The node 709 is connected via a resistor R8 to a node 713 and the node 713 is connected to the collector of an npn transistor 706. The emitter of the transistor 706 is connected to ground and the base of the transistor 706 is connected to the base of a pnp transistor 707. The collector of the transistor 707 is connected to ground and the emitter of the transistor 707 is connected via a current source 708 to the node 709.

An output voltage Vo7 is provided across the nodes 712 and 713.

This circuit of FIG. 7 provides a current with a specific stress dependency (e.g., to bias a Hall effect device thereby cancelling out the major part of a piezo-Hall dependency) and it provides an additional stress sensor output signal that might be used for fine compensation purposes of the stress-induced drift of some circuit that is arranged on the die.

The embodiments of FIG. 5 and FIG. 6 have two base-emitter junctions, i.e. a base-emitter junction of a pnp transistor and a base-emitter junction of an npn transistor connected in series. The current, however, is injected in the emitter of the pnp transistor, i.e. the transistor 501 in FIG. 5 and the transistor 601 in FIG. 6. As an alternative embodiment, the current may also be obtained from the emitter of the npn transistor. Then, the emitter current of the pnp transistor may be decoupled and sent via a resistor.

According to FIG. 7, a ratio between a current $I_{714}$ (current flowing into the emitter of the pnp transistor 705) and a current $I_{715}$ (current flowing from the current source 701 towards the node 711) amounts to:

$$\frac{I_{714}}{I_{715}} \sim \frac{1+\beta^{pnp}}{1+\beta^{npn}} \sim 1+(\pi^{pnp}-\pi^{npn})\cdot(\sigma_{xx}+\sigma_{yy}).$$

A right part 716 of the circuit of FIG. 7 is similar to the circuit shown in FIG. 6. In contrast to FIG. 6, the part 716 utilizes an npn collector current $I_{718}$ instead of the npn emitter current. It is noted that a difference between an emitter current and a collector current for an npn transistor with large current gain β may be negligible.

A ratio between the current $I_{718}$ (current flowing into the collector of the npn transistor 706) and a current $I_{719}$ (current flowing into the emitter of the pnp transistor 707) amounts to:

$$\frac{I_{718}}{I_{719}} \sim \frac{1+\beta^{npn}}{1+\beta^{pnp}} \sim 1+(\pi^{npn}-\pi^{pnp})\cdot(\sigma_{xx}+\sigma_{yy}).$$

This current ratio $$\frac{I_{718}}{I_{719}}$$

(which corresponds to the portion 716 of the circuit shown in FIG. 7) has a stress dependency with an opposite sign compared to the current ratio $$\frac{I_{714}}{I_{715}}$$

(which corresponds to a portion 717 on the left hand side of the circuitry shown in FIG. 7). Hence, twice the mechanical stress sensitivity can be obtained if the voltage drops across the resistors R7 and R8 are compared (by the output voltage Vo7).

It is further noted that the circuit of FIG. 7 increases an overall stress-sensitivity without the disadvantage of increasing the temperature drift, because the left portion 717 and the right portion 716 are each substantially temperature compensated.

The embodiments of FIG. 5 to FIG. 7 each shows that the npn transistor and the pnp transistor are coupled (directly or indirectly) by their bases. Hence, the base current of one of the transistors is derived from the base current of the other transistor. As an alternative, the npn transistor and the pnp transistor may be coupled via their emitters.

Figure 8B:
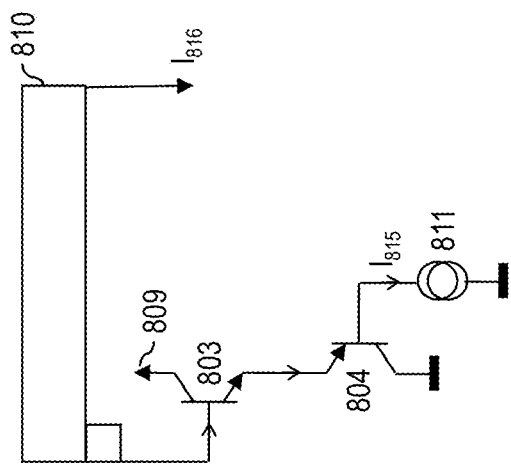
FIG. 8B shows another circuitry with the current being injected by a current source into the base of an npn transistor.
Figure 8A:
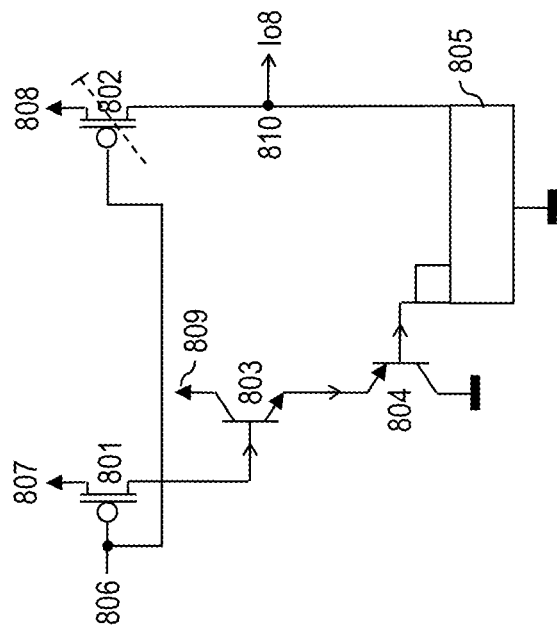
FIG. 8A shows a further circuitry with the current being injected by a current source into the base of an npn transistor.

FIG. 8A shows another circuit with the current being injected by a current source into the base of an npn transistor 803.

The gate of a PMOS 801 is connected to a node 806 and to the gate of a PMOS 802. The drain of the PMOS 801 is connected to the base of the npn transistor 803. The source of the PMOS 801 is connected to a node 807. The PMOS 801 and the PMOS 802 may (each) be regarded as current source, which are controlled via a signal applied to the node 806. The PMOS 802 may be adjustable. The source of the PMOS 802 is connected to a node 808 and the drain of the PMOS is connected to a node 810.

The collector of the transistor 803 is connected to a node 809 and the emitter of the transistor 803 is connected to the emitter of a pnp transistor 804. The collector of the transistor 804 is connected to ground. The base of the transistor 804 is connected to the input of a current mirror 805, the output of the current mirror 805 is connected to the node 810. The current mirror is also connected to ground.

An output current Io8 is suppled via the node 810. The nodes 807, 808 and 809 (or a portion of these nodes) may be connected to the same supply voltage or to different supply voltages.

Hence, a current is injected via the PMOS 801 (as a current source) into the base of the npn transistor 803. The emitter current of the transistor 803 flows into the emitter of the pnp transistor 804. The current flowing through the pnp transistor 804 is mirrored by the current mirror 805 and compared to (e.g., subtracted from) a current supplied by the PMOS 802 (as a current source) that is scaled from the original current flowing into the base of the npn transistor 803. Again the output current Io8 is substantially temperature compensated and stress dependent.

Alternatively, it is possible to sink a current out of the bases of the pnp transistor 804, connect the base of the npn transistor 803 to the input of a current mirror and compare the two base currents.

Such scenario is indicated in FIG. 8B. Here, the collector of the transistor 803 is connected to a node 809 and the emitter of the transistor 803 is connected to the emitter of a pnp transistor 804. The collector of the transistor 804 is connected to ground. The base of the transistor 804 is connected via a current source 811 to ground supplying a current $I_{815}$. The base of the transistor 803 is connected to an input of a current mirror 810. The output of the current mirror 810 provides a current $I_{816}$. The currents $I_{815}$ and $I_{816}$ can be compared to provide a stress-dependent output current signal.

It is noted that the transistors described herein, i.e. the pnp-type transistors (also referred to as pnp transistors) and the npn-type transistors (also referred to as npn transistors) are preferably bipolar junction transistors. They may be substrate bipolar transistors with one connection being the substrate.

It is further noted that the current mirrors can be realized using MOSFETs or bipolar junction transistors.

It is an option that the temperature coefficient of a current gain is (fully or at least partially) compensated such that an input current obtains a reverse temperature coefficient. With regard to the example visualized in FIG. 1, the current I0 may have a temperature coefficient such that:

$$\frac{I0}{1+\beta} = \text{constant}$$

in view of a varying temperature. Hence, if the current gain β increases by 2% per Kelvin (K), the current I0 also increases by 2% per K. The resistors R1 and R2 may be neglected for this consideration.

Hence, it is an option that the current that is forced to flow through the at least one bipolar junction transistor (from whose current gain the mechanical stress level is derived) has substantially the same temperature dependency as its current gain.

It is also an option that the circuitry comprises means for reducing a temperature dependency of an output signal compared to a temperature dependency of the at least one bipolar junction transistor.

This may be also applicable, e.g., for FIG. 4: The collector current of the transistor 401 could be made constant over temperature (i.e. the current provided by the transistor 401 does not change in case the temperature varies) by adding a temperature coefficient to the current source 405 that corresponds to the reciprocal value of the temperature coefficient of the current gain β of the transistor 401, i.e.:

$$I_{cp} = I_{401} \cdot \beta^{pnp}$$

Hence, if the current gain $\beta^{pnp}$ of the transistor 401 increases with rising temperature, the current $I_{401}$ is decreased (via controlling the current source 405) such that the product according to the formula above is (substantially) constant.

The same may apply to the transistor 402 and the current source 406.

Hence, the current source 405, 406 may be controlled such that the collector currents of the transistors 401 and 402 each are constant over a varying temperature. Also, the current sources 405, 406 (and optionally the current source 409) may be controlled such that the output current Io4 is constant over a varying temperature, i.e.:

$$Io4 = I_{409} + I_{401} \cdot \beta^{pnp} - I_{402} \cdot \beta^{npn},$$

wherein $I_{409}$ is the current provided by the current source 409.

As a result there are three degrees of freedom, i.e. the currents $I_{409}$, $I_{401}$ and $I_{402}$ to reach the goal of (substantially) temperature invariance.

It is also an option to consider a temperature coefficient of the output current Io4 itself and provide means for compensating the temperature variance of the output current Io4 in a subsequent processing stage. For example, the output current Io4 could be digitized by an analog-to-digital converter and processed in a digital circuitry, e.g., a microcontroller or processor. It is noted that such digitalized and optionally processed signal could be considered as output current of the circuitry, because it is based on the output current Io4. The conversion into the digital domain may be of advantage, because it provides a large degree of flexibility and it may make use of already existing digital components. For example, in many applications and circuitries, analog-to-digital converters are present as well as microcontrollers such that they may be utilized in the present context without a need for additional (or only very limited) hardware.

The examples suggested herein may in particular be based on at least one of the following solutions. In particular combinations of the following features could be utilized in order to reach a desired result. The features of the method could be combined with any feature(s) of the device, apparatus or system or vice versa.

A circuitry is suggested for providing a mechanical stress level signal, the circuitry comprising: at least one bipolar junction transistor, wherein the circuitry is arranged to determine a first mechanical stress level based on a current gain of the at least one bipolar junction transistor, to determine a second mechanical stress level based on the current gain of the at least one bipolar junction transistor, to provide the mechanical stress level signal based on the first mechanical stress level and the second mechanical stress level.

Hence, the mechanical stress level signal is provided based on a change of a mechanical stress applied to the circuitry, in particular to the at least one transistor of the circuitry.

In an embodiment, the circuitry comprises a processing unit for determining the first and second mechanical stress level and for providing the mechanical stress level signal.

In an embodiment, the mechanical stress level signal is determined based on a comparison between the first mechanical stress level and the second mechanical stress level.

In an embodiment, the first mechanical stress level is determined via at least two of the three terminals of a first bipolar junction transistor and the second mechanical stress level is determined via the same two terminals or different two out of three terminals of the first bipolar junction transistor.

In an embodiment, the at least one bipolar junction transistor comprises a first bipolar junction transistor and a second bipolar junction transistor, the first mechanical stress level is determined via at least two of the three terminals of the first bipolar junction transistor and the second mechanical stress level is determined via the same two terminals or different two out of three terminals of the second bipolar junction transistor.

In an embodiment, the first bipolar junction transistor is a pnp-type transistor and the second bipolar junction transistor is an npn-type transistor or vice versa.

In an embodiment, the at least one bipolar junction transistor comprises a first bipolar junction transistor and a second bipolar junction transistor, the first bipolar junction transistor is a pnp-type transistor and the second bipolar junction transistor is an npn-type transistor, whereby the circuit forces a ratio of either base currents or emitter currents or collector currents that is constant versus mechanical stress.

It is noted that "constant" also includes substantially constant. As a further example, the first bipolar junction transistor and the second bipolar junction transistor may be directly (or substantially directly) connected via their base terminals, via their collector terminals or via their emitter terminals.

The circuitry comprising two bipolar junction transistors of different types (npn and pnp type) and the two bipolar junction transistors being connected with one of their terminals of the same type (either emitter, collector or base) bears the advantages of temperature compensation and increases the mechanical stress sensitivity of the circuitry.

In an embodiment, the at least one bipolar junction transistor comprises at least one pnp-type transistor and at least one npn-type transistor, and a combined emitter area of npn-type transistors is larger than a combined emitter area of pnp-type transistors.

In an embodiment, the at least one bipolar junction transistor comprises a first number of pnp-type transistors and a second number of npn-type transistors, where the second number is higher than the first number, and at least one pnp-type transistor is connected to at least two npn-type transistors.

Hence, a single pnp transistor may be connected to several npn transistors. Such connection may be realized via the same type of terminal; i.e. the emitter of the pnp transistor may be connected to the emitters of several npn transistors. Instead of the emitter, the base or collector terminal may be used. In an embodiment, the current gain comprises a ratio of two of the following currents: a base current, a collector current, and an emitter current.

In an embodiment, the circuitry further comprises an adjustment component for determining the first mechanical stress level and for storing the first mechanical stress level.

Hence, the first mechanical stress level can be determined after production and/or assembly of the circuitry. It may be done by the manufacturer or by a user (in an application scenario) of the circuitry. It may also be done during runtime of the circuitry. The first mechanical stress level may be stored, e.g., in a memory (e.g., EPROM).

The first mechanical stress level can be adjusted to provide a predetermined result, e.g., reference voltage or reference current. Parameters to obtain such predetermined result are stored. Such parameters allows adjusting the first mechanical stress level to a reference stress level that can be advantageous for letter use-case scenarios: For example, the reference stress level may be chosen such that a deviation around this reference stress level, which deviation results from the respective use case scenario, is in a preferable range to be detected and processed.

In an embodiment, the adjustment component comprises at least one of the following: an adjustable current source, and an adjustable resistor.

The current source may be implemented by MOSFETs or bipolar transistors.

In an embodiment, the adjustment component comprises a temperature sensor which enables adjusting the first mechanical stress level dependent on a temperature determined by the temperature sensor.

It is in particular an option that the adjustable current source is controlled also based on the temperature determined by the temperature sensor. For example, a control unit may control the adjustable current source such that the predetermined result (reference) for the first mechanical stress level is obtained dependent on the actual temperature.

In an embodiment, the temperature sensor is arranged in or in the vicinity of a substrate of the at least one bipolar junction transistor.

In an embodiment, the at least one bipolar junction transistor comprises at least one of the following:
a vertical bipolar junction transistor,
two lateral bipolar junction transistors, wherein the two lateral bipolar junction transistors are arranged in an L-shape within an x-y-plane that is substantially parallel to the surface of a die, an arrangement comprising at least one lateral bipolar junction transistor where a first half of its base current flows in a first direction parallel to the substrate and a second half of the base current flows in a second direction parallel to the substrate, wherein the first direction and the second direction are substantially orthogonal to each other, and at least two cascading bipolar junction transistors.

In the vertical bipolar junction transistor, the base current flows (substantially) orthogonal to the surface of its substrate. In a lateral bipolar junction transistor, the base current flows (substantially) in parallel to the surface of the substrate.

In an embodiment, the current forced to flow through the at least one bipolar junction transistor has substantially the same temperature dependency as its current gain.

In an embodiment, the current at the base of the bipolar junction transistor is forced to have a temperature dependency that is reciprocal to a temperature dependency of its current gain, or the current at the collector or the emitter of the bipolar junction transistor is forced to have substantially the same temperature dependency as the temperature dependency of its current gain.

In an embodiment, the circuitry comprises means for reducing a temperature dependency of an output signal compared to a temperature dependency of the at least one bipolar junction transistor.

Also, a method is provided for determining a mechanical stress level signal, the method comprising: determining a first mechanical stress level based on a current gain of at least one bipolar junction transistor, determining a second mechanical stress level based on the current gain of the at least one bipolar junction transistor, and determining the mechanical stress level signal based on the first mechanical stress level and the second mechanical stress level.

In an embodiment, the at least one bipolar junction transistor comprises at least one npn-type transistor and at least one pnp-type transistor, and the first mechanical stress level and the second mechanical stress level are determined by comparing current gains of npn-type transistors and pnp-type transistors.

In an embodiment, a computer program product is provided which is directly loadable into a memory of a digital processing device, comprising software code portions for performing the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A stress sensor for generating a mechanical stress level signal, comprising:
    a semiconductor die to which a mechanical stress is applied, wherein the semiconductor die comprises:
    at least one bipolar junction transistor;
    at least one current source configured to inject at least one current through the at least one bipolar junction transistor; and
    a processing circuit configured to measure a first current gain and a second current gain of the at least one bipolar junction transistor based on the at least one injected current, to determine a first mechanical stress level based on the first current gain, to determine a second mechanical stress level based on the second current gain, and to generate the mechanical stress level signal based on the first mechanical stress level and the second mechanical stress level, wherein the mechanical stress level signal represents the applied mechanical stress, at least a portion of which is applied to the at least one bipolar junction transistor.

2. The stress sensor according to claim 1, wherein the processing circuit is configured to determine the mechanical stress level signal based on a comparison between the first mechanical stress level and the second mechanical stress level.

3. The stress sensor according to claim 1, wherein:
    the processing circuit is configured to measure currents at at least two of three terminals of a first bipolar junction transistor, and the processing circuit is configured to determine the first mechanical stress level from the measured currents of the at least two of three terminals of the first bipolar junction transistor, and
    the processing circuit is configured to measure currents at a same two terminals of the first bipolar junction transistor or to measure currents at two different terminals out of the three terminals of the first bipolar junction transistor, and the processing circuit is configured to determine the second mechanical stress level from the measured currents of the same two of terminals of the first bipolar junction transistor or from the measured currents of the two different terminals out of the three terminals of the first bipolar junction transistor.

4. The stress sensor according to claim 1, wherein:
    the at least one bipolar junction transistor comprises a first bipolar junction transistor having the first current gain and a second bipolar junction transistor having the second current gain,
    the processing circuit is configured to measure currents at at least two of three terminals of a first bipolar junction transistor, and the processing circuit is configured to determine the first mechanical stress level from the measured currents of the at least two of three terminals of the first bipolar junction transistor, and
    the processing circuit is configured to measure currents at a same respective two terminals of a second bipolar junction transistor or to measure currents at two different respective terminals out of three terminals of the second bipolar junction transistor, and the processing circuit is configured to determine the second mechanical stress level from the measured currents of the same two respective terminals of the second bipolar junction transistor or from the measured currents of the two different respective terminals out of the three terminals of the second bipolar junction transistor.

5. The stress sensor according to claim 4, wherein the first bipolar junction transistor is a pnp-type transistor and the second bipolar junction transistor is an npn-type transistor or vice versa.

6. The stress sensor according to claim 1, wherein:
    the at least one bipolar junction transistor comprises a first bipolar junction transistor and a second bipolar junction transistor, both in which base currents, emitter currents and collector currents are produced by the at least one current source,
    the first bipolar junction transistor is a pnp-type transistor and the second bipolar junction transistor is an npn-type transistor, and
    the first the first bipolar junction transistor is coupled to the second bipolar junction transistor such that a ratio of either base currents, emitter currents, or collector currents is constant versus mechanical stress.

7. The stress sensor according to claim 1, wherein:
    the at least one bipolar junction transistor comprises at least one pnp-type transistor and at least one npn-type transistor, and
    a combined emitter area of the at least one npn-type transistor is larger than a combined emitter area of the at least one pnp-type transistor.

8. The stress sensor according to claim 1, wherein:
    the at least one bipolar junction transistor comprises a first number of pnp-type transistors and a second number of npn-type transistors,
    the second number is greater than the first number, and
    at least one pnp-type transistor is connected to at least two npn-type transistors.

9. The stress sensor according to claim 1, wherein the first current gain and the second current gain each comprise a ratio of two of the following currents: a base current, a collector current, and an emitter current.

10. The stress sensor according to claim 1, further comprising:
    an adjustment component configured to adjust an adjustable current of the at least one injected current to adjust the first mechanical stress level to a reference stress level, and
    wherein the processing circuit is configured to store the first mechanical stress level in a memory.

11. The stress sensor according to claim 10, wherein the adjustment component is an adjustable current source or an adjustable resistor.

12. The stress sensor according to claim 10, wherein the adjustment component comprises a temperature sensor, and the adjustment component is configured to adjust the adjustable current based on temperature measured by the temperature sensor.

13. The stress sensor according to claim 1, wherein the at least one bipolar junction transistor comprises at least one of the following:
    a vertical bipolar junction transistor;
    two lateral bipolar junction transistors, wherein the two lateral bipolar junction transistors are arranged in an L-shape within an x-y-plane that is substantially parallel to the surface of a die;
    an arrangement comprising at least one lateral bipolar junction transistor where a first half of its base current flows in a first direction parallel to the substrate and a second half of the base current flows in a second direction parallel to the substrate, wherein the first direction and the second direction are substantially orthogonal to each other; and at least two cascading bipolar junction transistors.

14. The stress sensor according to claim 1, wherein:

a current at a base of a bipolar junction transistor of the at least one bipolar junction transistor is forced to have a temperature dependency that is reciprocal to a temperature dependency of its current gain, or a current at a collector or at an emitter of the at least one bipolar junction transistor is forced to have a same temperature dependency as a temperature dependency of its current gain.

15. The stress sensor according to claim 1, further comprising:

a means for reducing a temperature dependency of an output signal compared to a temperature dependency of the at least one bipolar junction transistor.

16. The stress sensor according to claim 1, wherein the processing circuit is configured to compare the first mechanical stress level with the second mechanical stress level, and generate the mechanical stress level signal based on the comparison.

17. A method for measuring mechanical stress by a stress sensor, comprising:

injecting at least one current through at least one bipolar junction transistor;

measuring a first current gain and a second current gain of the at least one bipolar junction transistor resultant from the at least one injected current;

determining a first mechanical stress level based on the first current gain of at least one bipolar junction transistor;

determining a second mechanical stress level based on the second current gain of the at least one bipolar junction transistor; and generating a mechanical stress level signal based on the first mechanical stress level and the second mechanical stress level, wherein the mechanical stress level signal represents the mechanical stress, which is applied to the at least one bipolar junction transistor.

18. The method according to claim 17, wherein the at least one bipolar junction transistor comprises at least one npn-type transistor and at least one pnp-type transistor, the method further comprising:

determining the first mechanical stress level and the second mechanical stress level by comparing current gains of the at least one npn-type transistor and the at least one pnp-type transistor.

19. The method according to claim 18, wherein generating the mechanical stress level signal comprises:

comparing the first mechanical stress level with the second mechanical stress level; and generating the mechanical stress level signal based on the comparison.

20. A non-transitory computer readable medium comprising code stored which, when executed, causes a computer program to perform the steps of the method according to claim 17.

* * * * *